United States Patent

Cassat et al.

[11] Patent Number: 5,110,633
[45] Date of Patent: May 5, 1992

[54] PROCESS FOR COATING PLASTICS ARTICLES

[75] Inventors: Robert Cassat, Ternay; Jean-Pierre Logel, Mulhouse, both of France

[73] Assignee: Ciba-Geigy Corporation, Ardsley, N.Y.

[21] Appl. No.: 570,499

[22] Filed: Aug. 21, 1990

[30] Foreign Application Priority Data

Sep. 1, 1989 [CH] Switzerland .................. 3172/89

[51] Int. Cl.$^5$ .............................................. B05D 1/18
[52] U.S. Cl. .................................. 427/430.1; 427/404; 205/166
[58] Field of Search .......................... 427/430.1, 404; 204/38.4, 38.5, 14.1

[56] References Cited

U.S. PATENT DOCUMENTS

| 3,146,125 | 8/1964 | Schneble et al. | 117/212 |
| 3,226,256 | 12/1965 | Schneble et al. | 117/212 |
| 3,347,724 | 8/1964 | Schneble et al. | 156/151 |
| 4,590,115 | 5/1986 | Cassat | 427/174 |

Primary Examiner—Bernard Pianalto
Attorney, Agent, or Firm—JoAnn Villamizar

[57] ABSTRACT

A process for coating a plastics article with a thin layer of noble metal, wherein said plastics article contains a finely particulate, homogenized filler selected from the group consisting of MnO, NiO, $Cu_2O$, SnO and $Bi_2O_3$, and said plastics article is coated with an acid aqueous solution of a noble metal salt.

13 Claims, No Drawings

PROCESS FOR COATING PLASTICS ARTICLES

The present invention relates to a process for coating plastics articles with a thin layer of noble metal and to the plastics articles so coated.

Metallizing the surface of plastics articles has become of increasing importance in different branches of industry. The electrically conductive coating of electrically insulating substrates is of particular importance in the electronics industry, for example in the production of printed circuits. However, metallized plastics parts are also used in the production of decorative and/or reflecting objects.

The common method of metallizing plastics materials is the electrochemical deposition of metals on to the surface of said materials. The procedure comprises, in a first step, pretreating the surface of the plastics material chemically or mechanically, in a second step applying a discontinuous coating of metal primer, subsequently applying a very thin continuous metal coating by means of a chemical reinforcing bath containing a metal salt and a reducing agent and, finally, immersing the pretreated substrate in an aqueous solution of a metal salt for galvanic metallization so as to obtain a thicker metal coating. The primer coating is applied, typically, by immersing the pretreated substrate in an acid stannic salt solution and then metallizing the article in an aqueous solution of a noble metal. Both baths may also be combined.

This method is fairly complicated and comprises numerous individual steps which involve troublesome process conditions. Whereas the chemical or mechanical pretreatment often results in damage to the substrate, the application of the metal primer often gives rise to problems owing to the insufficient wettability of the surface of the resinous substrate by the primer solution. The primer coating so obtained is of bad quality, discontinuous and has poor adhesion. This method and other special metallization techniques are disclosed in U.S. Pat. No. 4,590,115.

There has therefore been a need to provide a metallization process which is as easy as possible to perform, gives continuous metal coatings, and ensures improved adhesion of the metal coating to the surface of the plastics article.

Accordingly, the present invention relates to a process for coating a plastics article with a thin layer of noble metal, wherein said plastics article contains a finely particulate, homogenised filler selected from the group consisting of MnO, NiO, $Cu_2O$, SnO and $Bi_2O_3$, and said plastics article is coated with an acid aqueous solution of a noble metal salt.

The plastics article to be coated consists typically of 2.5–90% by weight, preferably 10–30% by weight, of the metal oxide, and 97.5–10% by weight, preferably 90–70% by weight, of a polymeric resin.

Suitable resins are in principle all thermoplastics, heat-curable resins and elastomers and mixtures of said resins.

Details and particulars of the eligible polymeric resins will be found in U.S. Pat. No. 4,590,115. What is stated therein applies also to the present invention.

The following resins are preferably used: epoxy resins, acrylate resins, polyimides, polyamides, polyesters, polyurethanes, polyacetals, polycarbonates, melamine resins, polytetrafluoroethylene, polyvinyl fluorides, polyethylene, polypropylene, ABS, polyphenylene sulfide, polyether imides, polyarylene ether ketones, PVC, melamine/formaldehyde resins and phenolic resins.

The preferred metal oxide is $Cu_2O$.

The metal oxide is incorporated into the resin by known methods. Particulars will again be found in U.S. Pat. No. 4,590,115. To ensure uniform continuous coatings of noble metal it is important that the metal oxide should be homogeneously distributed in the polymeric substrate. In principle, the polymeric substrates containing such fillers are known and described, for example, in U.S. Pat. No. 3,146,125 and in U.S. Pat. No. 4,590,115.

Whereas the metal oxides in the plastics articles of U.S. Pat. No. 3,146,125 are partially reduced with acids, the reduction of U.S. Pat. No. 4,590,115 is effected completely with borohydrides. This last mentioned method is quite troublesome, for the reducing agent can be used only in a thin layer on the surface to be metallised. Immersion in a reducing bath is not possible in this case, as the redox partners diffuse into the solution and the metal which forms for the coating is lost and the borohydride bath thereby ages rapidly.

Surprisingly, in the process of this invention it has been found that the noble metal particles which form adhere well to the surface of the plastics article to be metallised and that the loss of the metal through deposition in the bath is extremely small.

Particularly suitable aqueous solutions for the process of this invention are those which contain at least $10^{-5}$ mol/l of a noble metal salt. The upper limit is not critical and is governed solely by the solubility of the noble metal salts. The preferred concentration range is from 0.0005 to 0.005 mol/l. The noble metal layers which form have a typical thickness of $\leq 1$ μm and are continuous.

Particularly suitable noble metal salts are salts of Au, Ag, Ru, Rh, Pd, Os, Ir or Pt.

Any anions are suitable as long as the resultant salts are soluble in an acid aqueous solution in the above indicated concentrations.

Illustrative of suitable salts are: $AuBr_3(HAuBr_4)$, $AuCl_3(HAuCl_4)$ or $Au_2Cl_6$, silver acetate, silver benzoate, $AgBrO_3$, $AgClO_4$, AgOCN, $AgNO_3$, $Ag_2SO_4$, $RuCl_4.5H_2O$, $RhCl_3.H_2O$, $Rh(NO_3)_2.2H_2O$, $Rh_2(SO_4)_3.4H_2O$, $Pd(CH_3COO)_2$, $Rh_2(SO_4)_3.12H_2O$, $Rh_2(SO_4)_3.15H_2O$, $PdCl_2$, $PdCl_2.2H_2O$, $PdSO_4$, $PdSO_4.2H_2O$, $Pd(CH_3COO)_2$, $OsCl_4$, $OsCl_3$, $OsCl_3.3H_2O$, $OsI_4$, $IrBr_3.4H_2O$, $IrCl_2$, $IrCl_4$, $IrO_2$, $PtBr_4$, $H_2PtCl_6.6H_2O$, $PtCl_4$, $PtCl_3$, $Pt(SO_4)_2.4H_2O$ or $Pt(COCl_2)Cl_2$, as well as the corresponding complex salts such as $NaAuCl_4$, $(NH_4)_2PdCl_4$, $(NH_4)_2PdCl_6$, $K_2PdCl_6$ or $KAuCl_4$.

Those noble metal salts are preferred which contain $Cl^-$, $NO_3^-$, $SO_4^{2-}$ or $CH_3COO^-$ as anion and which may be in hydrated form. Particularly preferred noble metal salts are $PdCl_2$, $PdSO_4$, $PtCl_4$ and $HAuCl_4$.

The process of this invention is particularly simple because the plastics articles to be coated must solely be immersed in the aqueous acid solution of the noble metal salt. The application of the aqueous acid solution can be made by spraying, brushing, roller coating and other standard coating techniques. The metallization effected regardless of the shape of the plastics article at all areas which come in contact with the solution. Surprisingly, it has been found that it is advantageous to keep the solution in motion during the coating operation. This is done in known manner by shaking or, preferably, by stirring, for example with a magnetic stirrer, by agitating the substrate or by blowing in air. Suprisingly, the electrical resistance of the metal coating applied from a moving bath falls by several powers of ten compared with the products obtained from a stationary bath. If the contact between plastics article and noble metal salt solution is always maintained during the coating operation, i.e. if the agitation of the solution is not too vigorous, then the quality and adhesion of the noble metal layer is excellent.

The temperature of the bath is essentially not critical. It is preferred to carry out the coating in the temperature range from 10°-95° C., most particuarly at slightly elevated temperature, for example in the range from 20°-45° C.

Coating takes place in an acid solution. The pH of the solution also depends on the metal oxide filler. In the process of this invention, the pH of the noble salt solution is preferably in the range from 0.5-3.5, most preferably from 1.5-2.5. The optimum pH value for coating can be determined in advance experimentally for each metal oxide/noble metal salt system. It has been found that the optimum pH always lies in a fairly narrow range of <1 pH unit.

The adjustment of the optimum pH is made in conventional manner with strong acids such as mineral acids, carboxylic acids or sulfonic acid. Illustrative of such acids are hydrochloric acid, nitric acid, sulfuric acid, phosphoric acid, hydrofluoric acid, acetic acid or p-toluenesulfonic acid. Preferred acids are hydrochloric acid, nitric acid and sulfuric acid.

Particularly preferred coating baths are those in which the acid and the noble metal salt have the same anion.

The duration of the coating naturally depends on different parameters such as temperature, pH, concentration and agitation of the coating solution. Typical continuous coatings are usually formed in a few minutes.

The coating thickness so obtained will not suffice for certain applications, so that it is increased in a manner known per se by electrochemical or electrolytic metal deposition or by electrochemical and electrolytic metal deposition. In this coating build-up, any metal can be applied by electrolysis.

The coated plastics articles find utility in a very wide range of industrial applications in which metallic surfaces are required, for example in the automotive industry for frames of indicator instruments, radios, door handles, for window handles, heating grills, dashboard buttons, headlights, rear lights and the like, and also in the radio, TV and electronics industry, especially for printed circuits as well as in multi-layer and hybrid circuits and as chip supports, and in EMI shielding installations and the like. They can also be used in the aerospace industry, in dental and medicinal hygiene, in the optical industry, for example in mirror manufacture, and for household appliances.

EXAMPLE 1

25.16 parts of $Cu_2O$ and 5.09 parts of antimony trioxide are suspended in a laminating resin mixture based on bisphenol A diglycidyl ether having an epoxy value of 2.03 eq/kg, dissolved in methyl ethyl ketone, and containing
67.39 parts of resin
2.37 parts of hardener (dicyandiamide and 2-methylimidazole; 10:1)
Glass cloths (sold by Clark-Schwebel) of the type 7628 ((200 g/m²) are impregnated with this suspension in conventional manner. These prepregs are dried are compressed in 7 layers to panels of the following composition:

| | |
|---|---|
| resin/hardener | 38.5% by weight |
| glass cloth | 45.9% by weight |
| $Sb_2O_3$ | 1.3% by weight |
| $Cu_2O$ | 14.3% by weight |

The resin-rich surface is roughened with abrasive paper. The treated panels are immersed for 5 minutes at 21° C. in an aqueous solution of $PdCl_2$ (0.1 g/l) adjusted to pH 2.9 with HCl. During immersion, the bath is stirred with a magnetic stirrer (400 rpm). The resistance between 2 point contacts 8 mm apart is 40-45 ohm.

EXAMPLES 2-7

The reaction conditions and starting material are as described in Example 1, except that the stirring rate and the bath temperature are varied.

| Example | Stirring of the bath (rpm, magnetic stirrer) | Temperature of the bath (°C.) | Resistance (point contacts 8 mm apart) |
|---|---|---|---|
| 2 | none | 21 | ∞ ohm |
| 3 | 200 | 21 | 75-90 ohm |
| 4 | 300 | 21 | 100-110 ohm |
| 5 | 500 | 21 | 80 ohm |
| 6 | 400 | 35 | 25-35 ohm |
| 7 | 400 | 40 | 25 ohm |

EXAMPLES 8-9

Example 1 is repeated, but the immersion time of the panel in the $PdCl_2$ solution is varied.

| Example | Immersion time (minutes at 21° C.) | Resistance (point contacts 8 mm apart) |
|---|---|---|
| 8 | 3 | 150-160 ohm |
| 9 | 4 | 65-70 ohm |

EXAMPLES 10-14

The panel is coated under the same conditions as in Example 1, but additionally agitating it in the bath.

| Example | Stirring of the bath (rpm, magnetic stirrer) | Resistance (point contacts, 8 mm apart) |
|---|---|---|
| 10 | none | 2000-4000 ohm |
| 11 | 200 | 75 ohm |
| 12 | 300 | 75-80 ohm |
| 13 | 400 | 45 ohm |
| 14 | 500 | 30 ohm |

EXAMPLES 15-21

Coating is effected as described in Example 1, buty varying the pH of the bath by addition of HCl.

| Example | pH of the bath | Resistance (point contacts, 8 mm apart) |
|---|---|---|
| 15 | 3.25 | non-conductive |
| 16 | 3.05 | 400-460 ohm |
| 17 | 2.75 | 170-250 ohm |
| 18 | 2.50 | 80-90 ohm |
| 19 | 2.40 | 110-120 ohm |
| 20 | 2.15 | 190-200 ohm |

-continued

| Example | pH of the bath | Resistance (point contacts, 8 mm apart) |
|---------|----------------|------------------------------------------|
| 21      | 2.00           | 700–40000 ohm                            |

EXAMPLE 22

A polyamide molding (polyamide 66, type AP 50, sold by Rhône-Poulenc) containing 30% by weight of $Cu_2O$ is treated in a degreasing bath (EC 40-35, supplied by FRAPPAZ-IMASA) for 20 min. at 70° C. and then etched on the surface for 20 minutes at room temperature in an etching bath (150 ml of Kemifar Enplate MLB 497B, 30 ml of Kemifar Enplate MLB 497C, 80 g of potassium permanganate, 40 g of sodium hydroxide, bulked with water to 1 liter) to remove the mould skin. The $MnO_2$ deposited on the surface is removed by ultrasonic cleaning for 2 minutes in a 0.1M aqueous solution of hydrolylamine sulfate. The molding is metallized with palladium as described in Example 1 and the metal film is coated by an electrolytically deposited copper layer by immersion for 1 hour in a galvanising bath (KHT 482, supplied by FRAPPAZ-IMASA). This layer has a thickness of 35 microns.

EXAMPLE 23

Starting from a polyamide molding (reaction product of N,N'-4,4'-diphenylmethane-bismaleimide and diamino-4,4'-diphenylmethane) containing 20% by weight of glass and 40% by weight of $Cu_2O$, a relief of a meander 1.5 m long and 0.25 mm wide is etched by sand blasting. After treatment in dilute $HNO_3$, the mould skin on the raised portion of the relief is removed by abrasion. Conductive structures are obtained by treatment with a 0.05% aqueous solution of $PdCl_2$ and by addition of 1 ml of HCl (fuming, p.a.) per liter, while stirring the bath at 400 rpm (magnetic stirrer) and simultaneously agitating the molding in the bath at 44° C. for an immersion time of 6 minutes. In three tests, the structures have resistances of 59.7, 59.9 and 57 kiloohm which fall by less than 2% after 24 days. The non-abraded surface is not metallized in this experiment.

EXAMPLE 24

Using a molding as in Example 23 and under the conditions of Example 1, but using as metal salt bath 0.3 g/l of $HAuCl_4$.aq (51.5% by weight of Au), 0.6 ml/l of HCl (fuming, p.a.), in deionised water, a gold coating is deposited by immersion for 10 minutes at 28° C. The resistance of 4 sample coatings is 14.1, 14.5, 14.6 and 14.6 kiloohm. These values alter by less than 10% over 25 days. The non-abraded surface is not metallised in this experiment.

EXAMPLES 25-28

Following the procedure of Example 1, panels are coated using hexachloroplatinate as metallising component of the bath (0.14 g/l) and varying the pH of the hexachloroplatinate bath.

| Example | $H_2PtCl_6$ (g/l) | HCl (ml/l) | Resistance (point contacts, 8 mm apart) |
|---------|-------------------|------------|------------------------------------------|
| 25      | 0.14              | 0.14       | 480 ohm                                  |
| 26      | 0.14              | 0.28       | 220 ohm                                  |
| 27      | 0.14              | 0.42       | 580 ohm                                  |
| 28      | 0.14              | 0.56       | 620 ohm                                  |

EXAMPLES 29-47

Panels are coated as in Example 1, but varying the metal salts, the salt concentration, the bath temperature, the pH, the acids and the immersion time.

| Ex. | Salt | Conc. g/l | Bath temp./°C. | pH | Immersion time | Resistance/ohm |
|-----|------|-----------|----------------|-----|----------------|-----------------|
| 29 | $HAuCl_4$ | 0.05 | 20–22 | 2.8 (HCl) | 10 min | 500 |
| 30 | $HAuCl_4$ | 0.1 | 20–22 | 2.5 (HCl) | 10 min | 8 |
| 31 | $HAuCl_4$ | 0.5 | 20–22 | 2.3 (HCl) | 10 min | 6 |
| 32 | $HAuCl_4$ | 1.0 | 20–22 | 2.0 (HCl) | 10 min | 6 |
| 33 | $HAuCl_4$ | 2.5 | 20–22 | 1.4 (HCl) | 10 min | 8.5 |
| 34 | $HAuCl_4$ | 5.0 | 20–22 | 1.1 (HCl) | 10 min | 9.0 |
| 35 | $PtCl_4$ | 5.0 | 20–22 | 2.0 (HCl) | 10 min | 2000 |
| 36 | $PtCl_4$ | 0.5 | 40–45 | 2.0 (HCl) | 10 min | 1400 |
| 37 | $PtCl_4$ | 0.5 | 60–65 | 2.0 (HCl) | 10 min | 140 |
| 38 | $Pd(CH_3COO)_2$ | 0.5 | 40–45 | 2.0 ($CH_3COOH$) | 30 min | 50 |
| 39 | $Pd(CH_3COO)_2$ | 0.5 | 40–45 | 2.0 (HCl) | 30 min | 25 |
| 40 | $PtCl_4$ | 0.5 | 40–45 | 2.0 ($HNO_3$) | 30 min | 380 |
| 41 | $PtCl_4$ | 0.5 | 40–45 | 2.0 ($H_2SO_4$) | 30 min | 380 |
| 42 | $PtCl_4$ | 0.5 | 40–45 | 2.0 (HCl) | 30 min | 325 |
| 43 | $HAuCl_4$ | 0.5 | 40–45 | 2.0 ($H_3PO_4$) | 10 min | 25 |
| 44 | $PdSO_4$ | 0.5 | 40–45 | 1.5 (HCl) | 10 min | 20 |
| 45 | $PdCl_2$ | 0.5 | 40–45 | 2.4 ($H_3PO_4$) | 10 min | 25 |
| 46 | $PdCl_2$ | 0.5 | 40–45 | 1.7 ($HNO_3$) | 10 min | 25 |
| 47 | $PdCl_2$ | 0.5 | 40–45 | 2.4 ($H_2SO_4$) | 10 min | 18 |

EXAMPLE 48

Following the procedure described in Example 1, prepregs are prepared and pressed to panels whose surface is roughened with an abrasive paper. The treated panels are immersed for 5 minutes at 40°–45° C. in an aqueous solution of $PdCl_2$ (0.5 g/l) adjusted to pH 2.0 with HCl. The solution is agitated by blowing in air. The resistance between two point contacts 8 mm apart is 8.5 ohm.

EXAMPLE 49

An epoxy resin moulding prepared according to Example 1 is treated for 5 minutes at 60°–65° C. in a degreasing bath (Kemifar EC 4035, 10% by vol.) After rinsing with water, the molding is immersed for 15 minutes in warm N-methylpyrrolidone of 40° C. The molding is subsequently rinsed with water and etched on the surface for 30 minutes at 85° C. in an etching bath (150 ml of Kemifar Enplate MLB 497B, 30 ml of Kemifar Enplate MLB 497C, 80 g of potassium permanganate, 40 g of sodium hydroxide, bulked with water to 1 liter), while stirring the solution with a magnetic stirrer (400 rpm). After rinsing with water, the manganese dioxide deposited on the surface is removed by ultrasonic cleaning for 6 minutes in a 0.1 molar aqueous solution of hydroxylamine sulfate. The molding is rinsed again and then metallized by immersion in an aqueous solution of $PdCl_2$ (0.1 g/l) (6 min., 44° C., 1 ml/l of HCl), while stirring the bath with a magnetic stirrer (400 rpm). The molding is then cleansed with water and the metal film is coated with copper by electrolysis (65 min., 28° C., 3 $A/dm^2$) in a galvanising bath (Kemifar KHT 482). During the electrolysis, the molding is agitated and air is blown into the solution. The copper coating so obtained has a thickness of 41 microns and a bond strength of 13.5 N/cm.

EXAMPLE 50

A polyurethane layer containing 30% by weight of $Cu_2O$ is applied by in-mould coating to one side of a polyurethane molding. The moulding is treated for 30 minutes at 60°–65° C. in a degreasing bath (Kemifar EC 4035, 10% by vol.) After rinsing with water, the molding is etched on the surface for 20 minutes at room temperature in an etching bath (150 ml of Kemifar Enplate MLB 497B, 30 ml of Kemifar Enplate MLB 497C, 80 g of potassium permanganate, 40 g of sodium hydroxide, bulked with water to 1 liter), while stirring the solution with a magnetic stirrer (400 rpm). After rinsing with water, the manganese dioxide deposited on the surface is removed by ultrasonic cleaning for 10 minutes in a 0.1 molar aqueous solution of hydroxylamine sulfate. The molding is rinsed again and then metallized by immersion in an aqueous solution of $PdCl_2$ (0.5 g/l) (6 min., 40°–45° C., 1 ml/l of HCl, pH=1.9), while stirring the bath with a magnetic stirrer (400 rpm). The molding is then cleansed with water and the metal film is coated with copper by electrolysis (65 min., 28° C., 3 $A/dm^2$) in galvanizing bath (Kemifar KHT 482). During the electrolysis, the molding is agitated and air is blown into the solution. The copper coating so obtained has a thickness of 41 microns. The bond strength is greater than 6 N/cm. The side of the moulding which does not contain $Cu_2O$ is not metallised.

EXAMPLE 51

A polytetrafluoroethylene moulding containing 15% by weight of $Cu_2O$ is pretreated with an abrasive paper as in Example 1. The molding is then immersed for 5 minutes at 21° C. in an aqueous solution of $PdCl_2$ (0.5 g/l) adjusted to pH 2.2 with HCl. During immersion, the bath is stirred with a magnetic stirrer (400 rpm). The resistance between 2 point contacts 8 mm apart is 30 ohm.

The metal film is then coated with copper by electrolysis as described in Examples 49 and 50. The thickness of the copper coating is 10 microns.

EXAMPLE 52

An epoxy resin molding prepared according to Example 1 is immersed for 5 minutes at 40°–45° C. in an aqueous solution of $PdCl_2$ (0.5 g/l) adjusted to pH 2.0 with HCl. During immersion, the bath is stirred with a magnetic stirrer (400 rpm). The resistance between 2 point contacts 8 mm apart is 9 ohm.

What is claimed is:

1. A one-step process for coating a plastics article selected from the group consisting of thermoplastics, heat curable resins and elastomers with a thin layer of a noble metal, wherein said plastics article contains finely particulate, homogenized filler selected from the group consisting of MnO, NiO, $Cu_2O$, SnO, and $Bi_2O_3$ which process comprises contacting said plastics article with an acid aqueous solution of a noble metal salt having a pH in the range of 0.5 to 3.5.

2. A process according to claim 1, wherein the plastics article consists of 2.5–90% by weight of filler and 97.5–10% by weight of a polymeric resin.

3. A process according to claim 2, wherein the plastics article consists of 10–30% by weight of filler and 90–70% by weight of a polymeric resin.

4. A process according to claim 1, wherein 1 liter of the aqueous solution contains at least $10^{-5}$ mol of a noble metal salt.

5. A process according to claim 1, wherein the noble metal salt is a salt of Au, Ag, Ru, Rh, Pd, Os, Ir or Pt.

6. A process according to claim 1, wherein the noble metal salt contains $Cl^-$, $NO_3^-$, $SO_4^{2-}$ or $CH_3COO^-$ as anion.

7. A process according to claim 1, wherein the plastics article is immersed in an acid aqueous solution of a noble metal salt or said acid aqueous solution of a noble metal salt is applied to the surface of said plastics article.

8. A process according to claim 7, wherein the aqueous solution is kept in motion.

9. A process according to claim 8, wherein the solution is stirred.

10. A process according to claim 7, wherein the temperature of the solution is in the range from 10° to 95° C.

11. A process according to claim 10, wherein the temperature of the solution is in the range from 20° to 45° C.

12. A process according to claim 1, wherein the acid aqueous solution has a pH in the range from 1.5 to 2.5.

13. A process according to claim 1, wherein the coating thickness of the plastics article is increased, after coating, by electrochemical or electrolytic metal deposition or by electrochemical and electrolytic metal deposition.

* * * * *